United States Patent [19]
Ong

[11] Patent Number: 5,426,378
[45] Date of Patent: Jun. 20, 1995

[54] PROGRAMMABLE LOGIC DEVICE WHICH STORES MORE THAN ONE CONFIGURATION AND MEANS FOR SWITCHING CONFIGURATIONS

[75] Inventor: Randy T. Ong, Cupertino, Calif.

[73] Assignee: Xilinx, Inc., San Jose, Calif.

[21] Appl. No.: 231,009

[22] Filed: Apr. 20, 1994

[51] Int. Cl.[6] .................................. H03K 19/177
[52] U.S. Cl. ................................. 326/39; 326/38; 340/825.87
[58] Field of Search ............. 365/189.08; 340/825.85, 340/825.87, 825.89; 326/38, 39

[56] References Cited

U.S. PATENT DOCUMENTS

| | | | |
|---|---|---|---|
| 4,670,749 | 6/1987 | Freeman | 307/465 X |
| 4,876,466 | 10/1989 | Kondou et al. | 326/38 |
| 4,879,688 | 11/1989 | Turner et al. | 326/38 X |
| 4,972,105 | 11/1990 | Burton et al. | 326/38 X |
| 5,329,179 | 7/1994 | Tang et al. | 326/39 |
| 5,336,950 | 8/1994 | Popli et al. | 326/39 |
| 5,341,044 | 8/1994 | Ahanin et al. | 326/39 X |

OTHER PUBLICATIONS

Xilinx Programmable Gate Array Data Book, 1993, available from Xilinx, Inc., 2100 Logic Drive, San Jose, Calif. 95124.

Narasimha B. Bhat, Kamal Chaudhary, and Ernest S. Kuh, "Performance–Oriented Fully Routable Dynamic Architecture for a Field Programmable Logic Device", Electronic Research Laboratory, College of Engineering, University of California, Berkeley, 1 Jun. 1993.

Chi-Yuan Chin, et al., "A Dynamically Reconfigurable Interconnection Chip" Session XX: Special Purpose Accelerators; IEEE International Solid-State Circuits Conference, pp. 276–277, 425; Feb. 27, 1987.

André DeHon, "DPGA-Coupled Microporcessors: Commodity ICs for the Early 21st Century", NE4-3-791, 545 Technology Square, Cambridge, Mass. 02139, 10 pgs, Jan. 6, 1994.

Primary Examiner—David R. Hudspeth
Attorney, Agent, or Firm—Edel M. Young; Greg T. Sueoka

[57] ABSTRACT

A programmable logic device includes a configuration memory expanded to store two or more complete sets of configuration data. A switch on the output of the configuration memory controls the selection of the configuration data applied to the configurable logic block. Each configurable logic block has one data storage device per set of configuration data. The configurable logic blocks may be re-configured within a user's clock cycle.

During a first period, the switch on the output of the configuration memory selects and passes configuration data from the first set of configuration data. The configurable routing matrix and configurable logic block are configured according to this first set of configuration data and store results in a first storage device. During a second period, the switch selects and passes the second set of configuration data. Then the configurable routing matrix and configurable logic block are configured according to the second set of configuration data, the function generator performs the second logic function, and the outputs are passed or stored by the second output device. At the end of the last period the function is available to the user.

35 Claims, 13 Drawing Sheets

PROGRAMMABLE LOGIC DEVICE WHICH STORES MORE THAN ONE CONFIGURATION AND MEANS FOR SWITCHING CONFIGURATIONS

BACKGROUND OF THE INVENTION

1. Field of the Invention

This invention relates generally to programmable logic devices, and in particular to a system for re-configuring the configurable logic blocks and the programmable routing matrices of a field programmable gate array.

2. Description of the Related Art

The use of programmable logic devices such as field programmable gate arrays ("FPGAs") has become widespread because of the flexibility provided by their re-programmability. An FPGA typically includes an array of configurable logic blocks ("CLBs") that can be programmably interconnected to each other to provide the logic function desired by the user. The Xilinx 1993 data book entitled "The Programmable Logic Data Book," available from Xilinx, Inc., 2100 Logic Drive, San Jose, Calif. 95124, describes several FPGA products made by Xilinx, Inc., assignee of the present invention. This data book is incorporated herein by reference. An FPGA typically includes a regular array of identical CLBs. Each of the CLBs may be individually programmed to perform any one of a number of different logic functions. The FPGA has configurable routing matrices for coupling the CLBs together according to a desired configuration. The FPGA also includes a number of configuration memory cells. The configuration memory cells are coupled to the CLBs for specifying the function performed by each CLB, and to the configurable routing matrices for specifying the coupling of the inputs and outputs of the CLBs. The FPGA also typically includes data storage memory cells accessible to a user during operation of the FPGA, but the discussion here of memory cells refers to configuration memory cells. Each CLB is coupled to several memory cells that specify the function that the CLB will perform, and the other CLBs to which it will be coupled. Thus, by storing different values in the memory cells, each CLB may be individually programmed as to its function and coupling.

The configuration data for the CLBs and the configurable routing matrices is stored in the configuration memory cells. The configuration data, once loaded into the configuration memory cells, selects the functions performed by the CLBs and connects the configurable routing matrices.

Recently, there has been a dramatic increase in the complexity and size of logic circuits used in a variety of applications. Since the number of CLBs that can be fabricated on a single integrated circuit chip is limited, this increasing number of circuit elements cannot be implemented with a single FPGA. Thus, there is a need to improve the efficiency with which CLBs implement logic functions.

One prior art approach to solve this shortcoming of existing FPGAs has been to connect multiple FPGAs externally. This approach, however, is only a partial solution. Due to the limited number of input/output connections between the FPGAs, not all circuits can be implemented by this approach. Moreover, using more than one FPGA increases the power consumption, cost, and space required to implement the circuit.

Another solution has been to increase the number of CLBs and interconnecting structures in the FPGA. For any given fabrication technology, there will be limitations to the number of CLBs that can be fabricated on an integrated circuit chip. Thus, there continues to be a need, from an architectural standpoint, to increase the logic gates or CLB densities for FPGAs.

While the prior art FPGAs may be re-configured to perform different logic functions at different times, it is necessary to reload a bit stream, which is time consuming. Re-configuration of an FPGA requires suspending the implementation of the logic functions, saving the current state of the logic functions in a memory device that is off the FPGA, re-loading the array of memory configuration cells, and inputting the states of the logic functions along with any other inputs. The re-loading of the configuration memory cells, itself, requires an amount of time that makes re-configuration not viable for implementing many circuits. It is more beneficial to increase the number of logic functions that are performed within an FPGA without sacrifices in speed and space.

SUMMARY OF THE INVENTION

The present invention increases the number of logic functions that may be implemented within an FPGA by internally re-configuring the CLBs and the configurable routing matrices to perform multiple logic functions. The present invention comprises more than one array of configuration memory cells and a switch to output configuration data alternately from each of the arrays, a CLB having a special storage device, and a configurable routing matrix. A first array stores one set of configuration data, a second array stores a second set of configuration data, and so forth. Each CLB accesses a storage device that has a first data latch for storing inputs or outputs of the CLB when the CLB is configured according to the data stored in the first array, a second data latch for storing inputs or outputs of the CLB when the CLB is configured according to the data stored in the second array, etc. Each storage device may also include a first register for clocking out or in data from the first data latch and a second register for clocking out or in data from the second data latch.

The user of the FPGA inputs a clock signal on which the FPGA will operate. One embodiment of the present invention divides the user's clock cycle into two portions and provides storage devices to receive outputs of the CLBs.

During the first portion, the switches output the configuration data stored in the first array, and the CLBs and configurable routing matrices are configured according to the configuration data stored in the first array. In this first portion, the FPGA executes a first set of logic functions of the signals input to the CLBs. The output of the second data latch and the second register are available as input signals to the CLBs. After all CLBs have performed their logic functions of the inputs, the output of each CLB is stored in the first data latch of the output device of the CLB.

During the second portion, the switches output the configuration data stored in the second array, and the CLBs and configurable routing matrices are configured according to the configuration data stored in the second array. The FPGA then executes the logic functions of the inputs to the CLBs. After the CLBs have performed their logic functions of the inputs, the output of each CLB is stored in the second data latch of the CLB. During this second portion of the user's clock cycle, the outputs of the first data latches and the first registers are available as inputs to the CLBs.

At the end of the user's clock cycle, the data stored in the first and second latches may be transferred into the first and second registers, respectively. The FPGA then outputs the results of its function. Where each CLB of the prior art could implement one logic function during a cycle of the user's clock, each CLB, according to the embodiment having two arrays of configuration data, may implement two logic functions during a cycle of the user's clock. Thus, the above embodiment has doubled the number of logic functions that the FPGA can implement over the prior art. More generally, if the FPGA includes five or ten arrays of configuration data and five or ten latches and registers for each CLB, the FPGA can implement five or ten times the logic of a prior art FPGA.

DETAILED DESCRIPTION OF THE DRAWINGS

Figure 1:
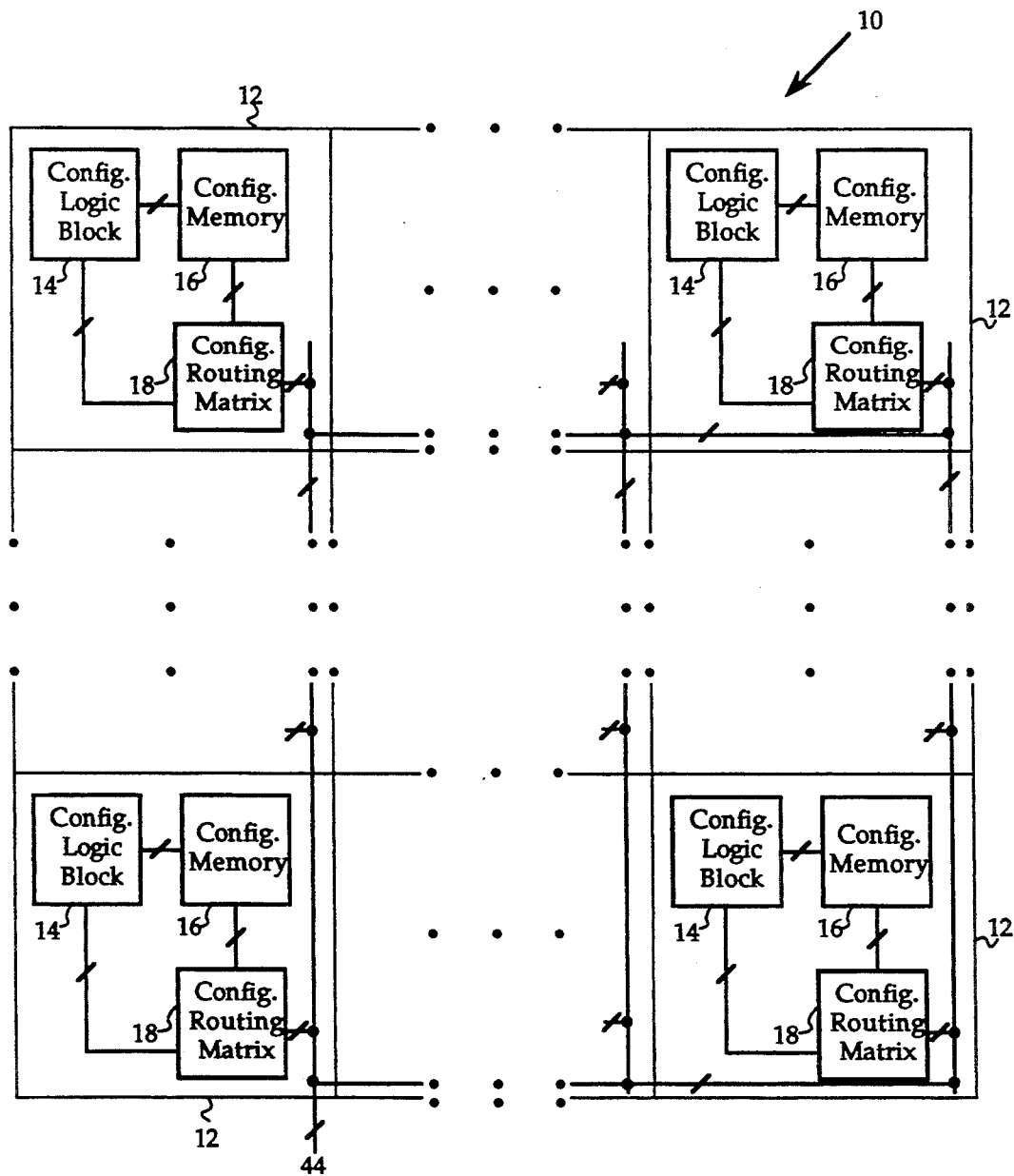
FIG. 1 is a block diagram showing one embodiment of an FPGA with which the present invention may be used.

Referring now to FIG. 1, a block diagram of a field programmable gate array ("FPGA") 10 is shown. The FPGA 10 comprises a plurality of tiles 12, each of which in turn comprises a configurable logic block ("CLB") 14, a configuration memory 16, and a configurable routing matrix 18. The routing matrices 18 connect to each other and thus interconnect the CLBs. The routing matrices also connect to external pins on lines 44. Typically the routing matrices 18 include both global lines for carrying such signals as clock signals and local lines or line segments for inter-connecting the CLBs. The user of the FPGA 10 inputs a clock signal, the user's clock, on which the FPGA 10 will operate. The user's clock signal (or signals) is carried to all parts of the FPGA 10 on one (or more) of the lines 44.

Each tile 12 implements a portion of a user's circuit. The logic function of each tile 12 is carried out by its respective CLB 14. Each CLB 14, and thus each tile 12, is capable of performing a great multitude of different logic functions. The logic function performed by a CLB 14 is determined by the data stored in the configuration memory 16 corresponding to the CLB 14. The CLB 14 has inputs for logic function data and configuration data and has outputs for logic function data.

Each CLB 14 is coupled to other CLBs 14 of the FPGA 10 and to the inputs and the outputs of the FPGA 10 through the configurable routing matrix 18. The configurable routing matrix 18 has configuration inputs for receiving configuration data and in response controls the coupling of the data inputs and outputs of the CLBs 14. According to the data stored in the configuration memory 16, the configurable routing matrix 18 selectively connects the outputs of CLBs 14 and the inputs of the FPGA 10 to the data inputs of CLBs 14. The configurable routing matrix 18 also directs the outputs of the CLBs 14 to the outputs of the FPGA 10.

In an embodiment which latches function generator outputs separately for separate cycles, the configurable routing matrix 18 and CLB 14 are larger than in a comparable device built according to the prior art. The number of outputs of the CLB 14 is greater than in the prior art, and therefore the configurable routing matrix 18 is also larger to accommodate the additional outputs of the CLBs 14. The configurable routing matrix 18 is coupled to the corresponding CLB 14 and to other routing matrices 18.

Configuration data for each CLB 14 and each configurable routing matrix 18 of a tile 12 are stored in the corresponding configuration memory 16. The configuration data are loaded into the configuration memory 16 from outside the FPGA 10, and may be loaded through a shift register having at least one external pin. Such a loading means is discussed by Freeman in Re U.S. Pat. No. 34,363 incorporated herein by reference. The outputs of each configuration memory 16 are coupled to its respective CLB 14 and configurable routing matrix 18.

CONFIGURATION MEMORY

Figure 2:
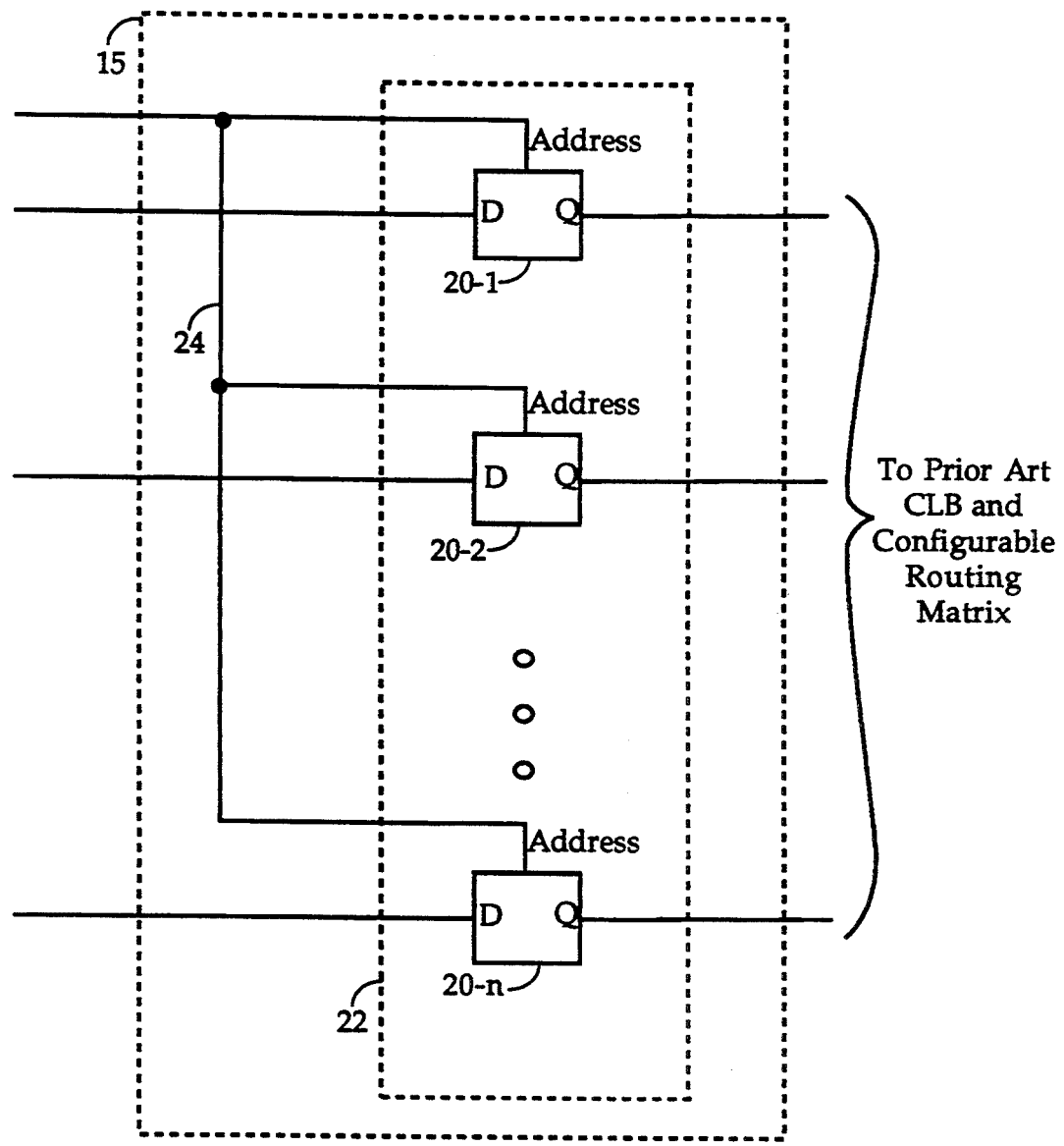
FIG. 2 is a block diagram showing a column of the array of configuration memory cells of a prior art FPGA.

Referring now to FIG. 2, a block diagram of a portion of a prior art configuration memory 15 is shown. The prior art configuration memory 15 comprises a plurality of memory cells 20-1 to 20-n arranged in an array. FIG. 2 shows one column 22 of the array. The actual array has many columns.

Each memory cell 20-1 to 20-n stores a single bit of binary data. Each memory cell 20-1 to 20-n has a data input, a data output, and an address input. Data are stored in the memory cells 20-1 to 20-n in response to an addressing signal. Data are stored in the array a column at a time. The address signal is carried to the memory cells 20-1 to 20-n on an address bus 24 that is coupled to the address input of each memory cell 20-1 to 20-n.

Thus, the address inputs of the memory cells 20-1 to 20-n in the same column 22 are coupled together. The data inputs of the memory cells 20-1 to 20-n are coupled to a conventional data bus to receive configuration data. The outputs of the memory cells 20-1 to 20-n are coupled to the CLB 14 and to the configurable routing matrix 18. The address line 24 is part of a conventional bus that is coupled to an addressing means. Those skilled in the art will recognize how to construct the addressing means and the configuration means.

Figure 3:
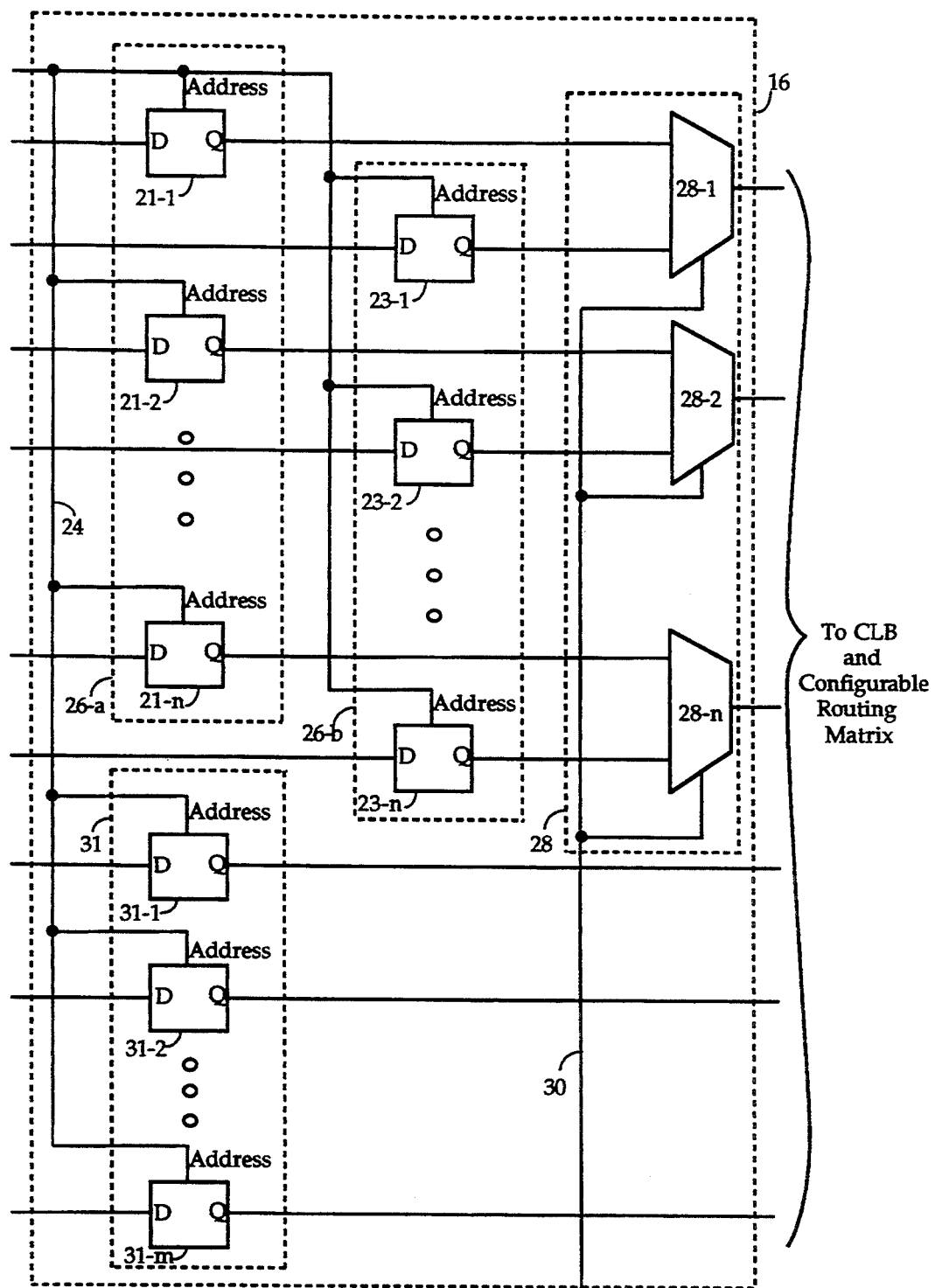
FIG. 3 is a block diagram showing a column of the first array of configuration memory cells, a column of the second array of configuration memory cells, a third column of memory cells, and a switch for alternately coupling the first and second columns according to the present invention.

Referring now to FIG. 3, a block diagram of a portion of a configuration memory 16 constructed according to the present invention is shown. The configuration memory 16 of the present invention comprises a first set of memory cells 21-1 to 21-n, a second set of memory cells 23-1 to 23-n, and a switching means 28 having a plurality of switches 28-1 to 28-n. While the first set of memory cells 21-1 to 21-n will now be described as a first array and the second set of memory cells 23-1 to 23-n as a second array, those skilled in the art will realize that there may be more than two arrays. Alternatively, the first and second arrays may be portions of a single array and may even be alternating cells in a column of configuration memory cells. FIG. 3 shows a column 26-a of the first array and a column 26-b of the second array. In an actual device, each array has many columns for configuring many tiles 12 of FIG. 1. The first array and the second array both store a complete set of configuration data for the CLBs 14 and the configurable routing matrices 18. Thus, the configuration memory 16 according to the present invention includes more memory cells 21-1 to 21-n, 23-1 to 23-n than the prior art configuration memory 15 included. In accordance with the present invention, each CLB 14 and configurable routing matrix 18 may be configured using either the configuration data stored in the first array or the configuration data stored in the second array.

Additional memory cells 31 may be provided, which do not switch upon reconfiguration but hold a constant configuration for a long time. Outputs of memory cells 31 also provide data for configuring the tiles 12.

As with the prior art configuration memory 15, the address inputs of the memory cells 21-1 to 21-n, 23-1 to 23-n and 31-1 to 31-m are coupled together by the addressing line 24. Each column of the first array corresponds to a column of the second array. In FIG. 3, column 26-a corresponds to column 26-b. A column of the first array has the same address as the corresponding column of the second array. A column of the third array also shares this address. Thus, when the address signal corresponding to columns 26-a, 26-b and 31 is asserted on the addressing line 24, column 26-a, column 26-b and column 31 are coupled to receive data from a configuration means. Data from memory cells 21-1 to 21-n, 23-1 to 23-n and 31-1 to 31-m are always available at the Q output. The output of the first two arrays of configuration memory cells 21-1 to 21-n and 23-1 to 23-n is coupled to a respective switch 28-1 to 28-n. There are usually the same number of configuration memory cells 21 in the first array as there are configuration memory cells 23 in the second array. Furthermore, there are usually the same number of switches 28-1 to 28-n in the switching means 28 as there are configuration memory cells 21, 23 in the first array or the second array.

Each switch 28-1 to 28-n has two data inputs and a select input. A first data input of each switch 28-1 to 28-n is coupled to a respective one of the memory cells 21-1 to 21-n of column 26-a and a second data input is coupled to a respective one of memory cells 23-1 to 23-n of column 26-b. As shown in FIG. 3, the output of memory cell 21-1 of column 26-a and the output of memory cell 23-1 of column 26-b are coupled to the first and second inputs of switch 28-1, respectively. Likewise, the output of memory cell 21-2 of column 26-a and the output of memory cell 23-2 of column 26-b are coupled to the first and second inputs of switch 28-2, respectively. In the embodiment shown in FIG. 3, the switches 28-1 to 28-n are 2:1 multiplexers. Each switch 28-1 to 28-n passes either the signal at the first data input or the signal at the second data input in response to a signal applied to the select input. The select input of each switch 28-1 to 28-n is coupled to the A/B line 30 for receiving the A/B select signal. When the A/B select signal is "high," the switches 28-1 to 28-n pass the inputs from the memory cells 21-1 to 21-n of column 26-a. When the A/B select signal is "low," the switches 28-1 to 28-n pass the inputs from the configuration memory cells 23-1 to 23-n of column 26-b. The outputs of the switches 28-1 to 28-n are coupled to the CLB 14 and to the configurable routing matrix 18. By asserting and not asserting the A/B select signal on the A/B line 30, the configuration data stored in the first array and the configuration data stored in the second array are selectively passed to the CLB 14 and the configurable routing matrix 18. Thus, the CLBs 14 and the configurable routing matrices 18 may be re-configured according to the two alternative sets of configuration data. Since the switches 28-1 to 28-n can switch very quickly, the configuration data provided to the CLB 14 and the configurable routing matrix 18 may be quickly switched between a first set of configuration data stored in the first array and a second set of configuration data stored in the second array. In this embodiment, the switching is of such a speed that the CLB 14 and the configurable routing matrix 18 may be effectively re-configured twice within a single cycle of the user's clock.

While the switching means 28 has been described as a plurality of 2:1 multiplexers, those skilled in the art will realize that the n 2:1 multiplexers may be replaced with a variety of other multiplexer configurations that receive 2x inputs and send x outputs. For example, the n 2:1 multiplexers may be replaced with n/4 8:4 multiplexers.

While the above embodiment of the configuration memory 16 has been described as having a first set of memory cells, a second set of memory cells, and a switching means that switches between two inputs, those skilled in the art will realize that additional sets of memory cells may be provided and the switching means 28 may output the data from any one of the first, second, or the additional sets of memory cells. Such embodiments, with additional sets of memory cells, would allow the CLBs 14 and configurable routing matrices 18 to be re-configured three, four, or more times within a single cycle of the user's clock.

Figure 4:
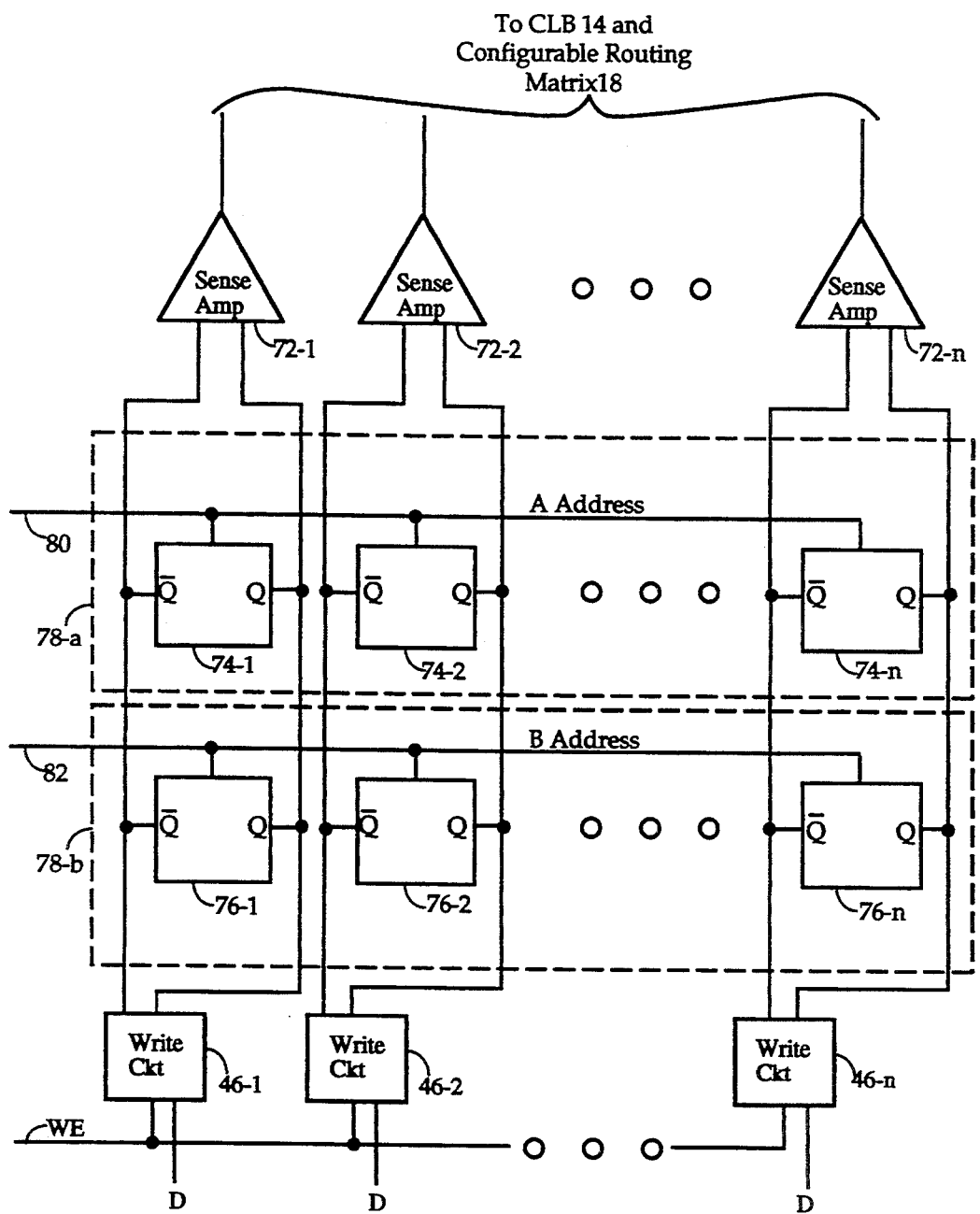
FIG. 4 is a block diagram showing an alternative embodiment of the configuration memory of the present invention.

Referring now to FIG. 4, an alternative embodiment of the configuration memory 16 is shown. In this embodiment, the multiplexers 28-1 to 28-n, memory cells 21-1 to 21-n, and memory cells 23-1 to 23-n are replaced with column sense amplifiers 72-1 to 72-n, static random access memory (SRAM) cells 74-1 to 74-n and 76-1 to 76-n, respectively. In this embodiment, columns 26-a and 26-b are replaced with rows 78-a and 78-b, respectively, which are loaded by conventional write circuits 46-1 to 46-n. Multiplexers 28-1 to 28-n are not used. Instead, the row output signals are buffered by column sense amplifiers 72-1 to 72-n. The A/B line 30 is replaced with an A address line 80 and a B address line 82. When the signal on the A address line 80 is "high" and the signal on the B address line 82 is "low," data in SRAM cell row 78-a are presented to sense amplifiers 72-1 to 72-n, and then presented to the CLB 14 and the configurable routing matrix 18. When the signal on the A address line 80 is "low" and the signal on the B address line 82 is "high," the data in SRAM cell row 78-b is presented to sense amplifiers 72-1 to 72-n, which is then presented to CLB 14 and the configurable routing matrix 18. Those skilled in the art will be able to generate a means to alternately set the signal on the A address line 80 "high" and then the signal on the B address line 82 "high." One skilled in the art will recognize that more SRAM cell rows 78 may be added to provide more than two sets of configuration data, and therefore, increase the number of times the CLB 14 and configurable routing matrix 18 can be re-configured during the user's clock cycle.

CONFIGURATION LOGIC BLOCKS

Figure 5:
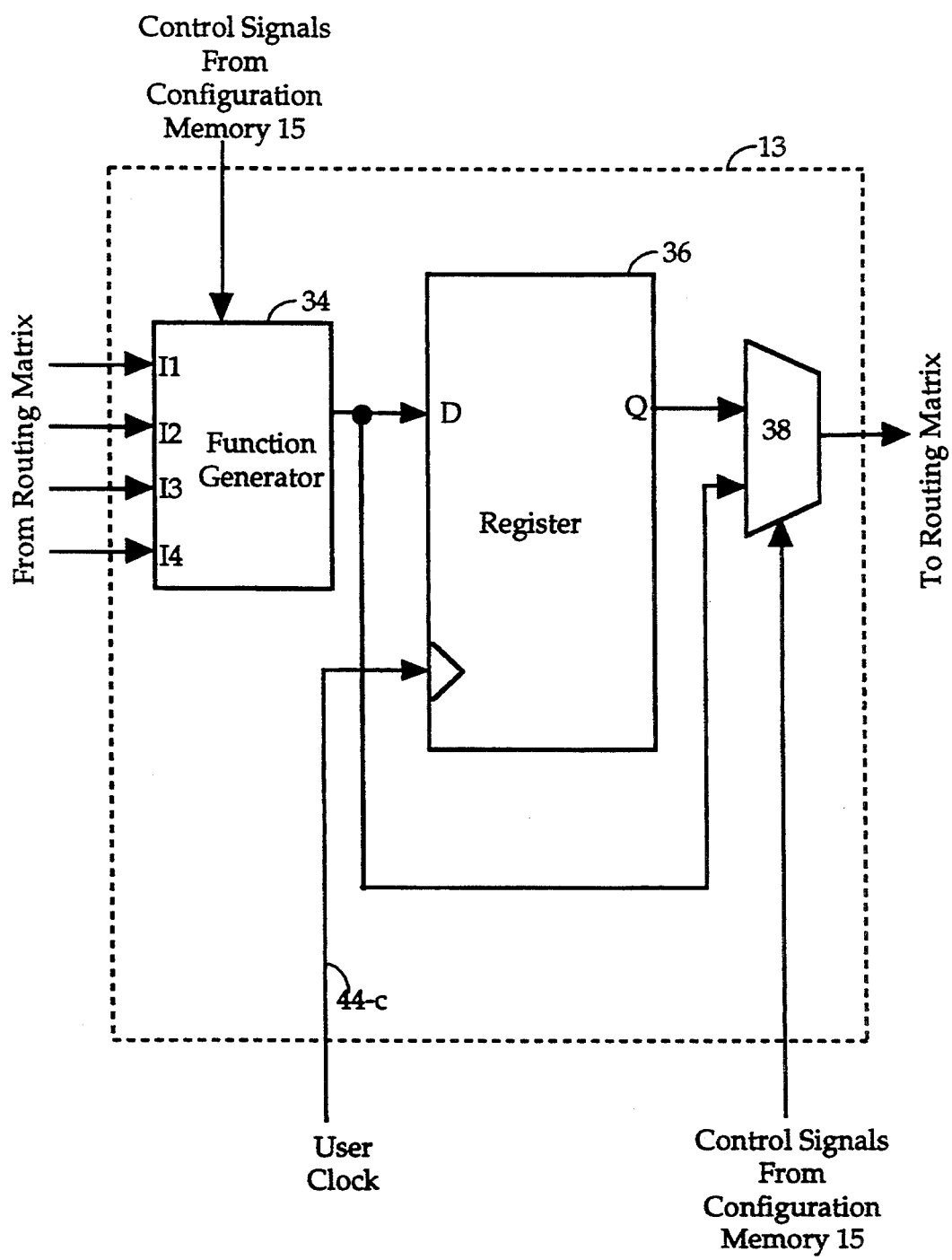
FIG. 5 is a block diagram showing a prior art configurable logic block of an FPGA.

Referring now to FIG. 5, a block diagram of a prior art CLB 13 is shown. The prior art CLB 13 comprises a function generator 34, a register 36, and an output switch 38. The function generator 34 implements logic functions of several inputs according to the data stored in the configuration memory 15. The particular logic function is selected by configuration data. The inputs are coupled to a prior art routing matrix. Configuration data come from a configuration memory 15 associated with the CLB 13.

The output of the function generator 34 is coupled to the output switch 38 either directly or through the register 36. The register 36 is a conventional data storage register such as a D-flip-flop. The register 36 has a data input that is coupled to the output of the function generator 34, and a clock input that is coupled to receive a user's clock signal on one line 44-c of the lines 44. The register 36 has a data output Q.

The output switch 38 has two data inputs, one data output, and a select input and may be a 2:1 multiplexer. Typically, the configuration memory controls the select input of switch 38.

Figure 6A:
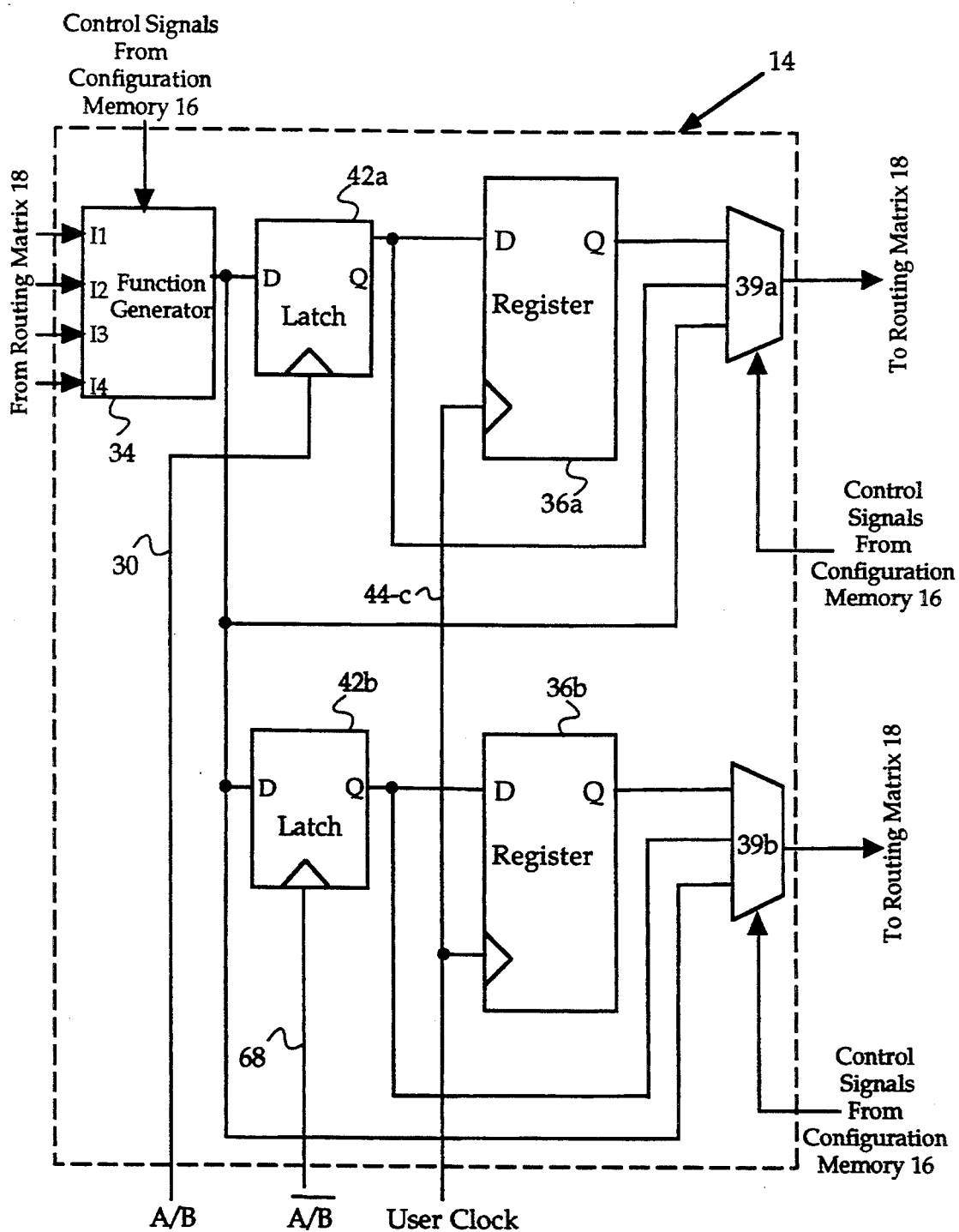
FIG. 6A is a block diagram showing a configurable logic block according to one embodiment of the present invention.

Referring now to FIG. 6A, a block diagram of one embodiment of a CLB 14 constructed according to the present invention is shown. The CLB 14 according to this embodiment comprises a function generator 34, a first data latch 42a, a second data latch 42b, a first register 36a, a second register 36b, a first output switch 39a, and a second output switch 39b. Advantageously, the first data latch 42a, the first register 36a, and the first output switch 39a provide the output of the function generator 34 when function generator 34 is configured with outputs of the first set of memory cells 21 (FIG. 3). Thus, the data stored by the first data latch 42a or by register 36a may be used in the second half of the user's clock cycle when the CLB 14 is configured according to the second set of configuration data from memory cells 23. The second data latch 42b, the second register 36b and the second switch 39b are similarly used to store and to route the output of the function generator 34 when it is configured according to the second set of configuration data of memory cells 23.

The function generator 34 is equivalent to that of FIG. 5 above. The data inputs of the function generator 34 are coupled to the configurable routing matrix 18, and the control inputs are coupled to the configuration memory 16 of the present invention. Thus, the function generator 34 may be re-configured by the control signals as other parts of the CLB 14 are reconfigured.

The first data latch 42a is a conventional data latch for storing a binary bit of data. The first data latch 42a has a data input (D), a data output (Q), and a latch enable input (clock input). The data input of the first data latch 42a is coupled to the output of the function generator 34. The latch enable input is coupled to A/B line 30 to receive an A/B signal. The first data latch 42a either latches or passes data in response to the signal applied to the latch enable input. The first data latch 42a passes data during a first portion of the user's clock cycle and latches data during the second portion of the user's clock cycle. In this embodiment, the latch enable signal is asserted low such that data are passed on a "high" A/B signal and latched on a "low" $\overline{A/B}$ signal. The second data latch 42b has the same functionality and structure as the first data latch 42a. The data input of the second data latch 42b is coupled to the output of the function generator 34. The latch enable input of the second data latch 42b, however, is coupled to a line 68 to receive the signal. Since the second data latch 42b receives a signal at its latch enable input that is the inverse of the signal applied to the first data latch 42a, the data latches 42a, 42b will pass and latch data at opposite times during the user's clock cycle.

One skilled in the art will recognize that an inverter driven from the A/B line 30 can be used to drive the latch enable input of latch 42b, and therefore eliminate the need for the $\overline{A/B}$ line 68.

The first register 36a is a data register of the type describe in connection with FIG. 5 above. For example, the first register 36a may be a D-flip-flop. The data input of register 36b is coupled to the data output of the first data latch 42a. The clock input of the first register 36a is coupled to a line 44-c to receive the user's clock signal. Similarly, the second data register may be a D-flip-flop. The data input of the second register 36b is coupled to the data output of the second data latch 42b, and the clock input is coupled to the line 44-c to receive the user's clock signal.

The first output switch 39a is a conventional switching device such as a 3:1 multiplexer. The output switch 39a, 39b has three data inputs, one data output, and a command input. A first data input of output switch 39a is coupled to the output of the register 36a. A second data input of output switch 39a is coupled to the data output of data latch 42a. In this embodiment, the output of function generator 34 is coupled to a third data input of output switch 39a. The output switch 39a outputs one of the signals applied on the three inputs in response to signals to the control inputs of the output switch 39a. The control inputs are coupled to associated memory cells 21, 23, or more commonly 31 in the configuration memory 16 of the present invention and typically remain unchanged when the A/B line 30 switches.

The second output switch 39b is also a 3:1 multiplexer. The second output switch 39b includes first, second, and third data inputs; a data output; and a pair of control inputs. The first data input is coupled to the output of the second register 36b; the second data input is coupled to the output of the second data latch 42b. The third input of the output switch 39b is coupled to the output of the function generator 34. The control inputs are coupled to associated memory cells 21, 23, or 31 in the configuration memory 16 for controlling which of the three inputs signal will be output from the second output switch 39b. The output of the second output switch 39b forms one of the outputs of the CLB 14.

This embodiment of the present invention advantageously increases the number of logic functions implemented by the FPGA 10 by re-configuring the CLBs 14 so that they perform more than one logic function during a cycle of the user's clock. A two-period embodiment of the present invention divides the cycle of the user's clock into two periods, an A period and a B period. The A period and the B period may be, but need not be, equal. During the A period, a two-period embodiment of the present invention configures the CLBs 14 and the configurable routing matrices 18 using the configuration data stored in the first array of the configuration memory 16. The CLBs 14 then perform their logic functions, and the A period ends. During the B period, the CLBs 14 and configurable routing matrices 18 are re-configured by applying the configuration data stored in the second array of the configuration memory 16. The CLBs 14 then perform their logic functions, and the B period and the cycle of the user's clock ends. Thus, in the present embodiment, the present invention has doubled the number of logic functions that the FPGA 10 can perform during a cycle of the user's clock.

FIG. 6A shows a CLB 14 when the present invention comprises two sets of configuration data. The present invention may comprise any number of sets of configuration data. For each set of configuration data, each CLB 14 has an additional output path including data latch 42, register 36, and switch 39 for generating an output signal.

Figure 6B:
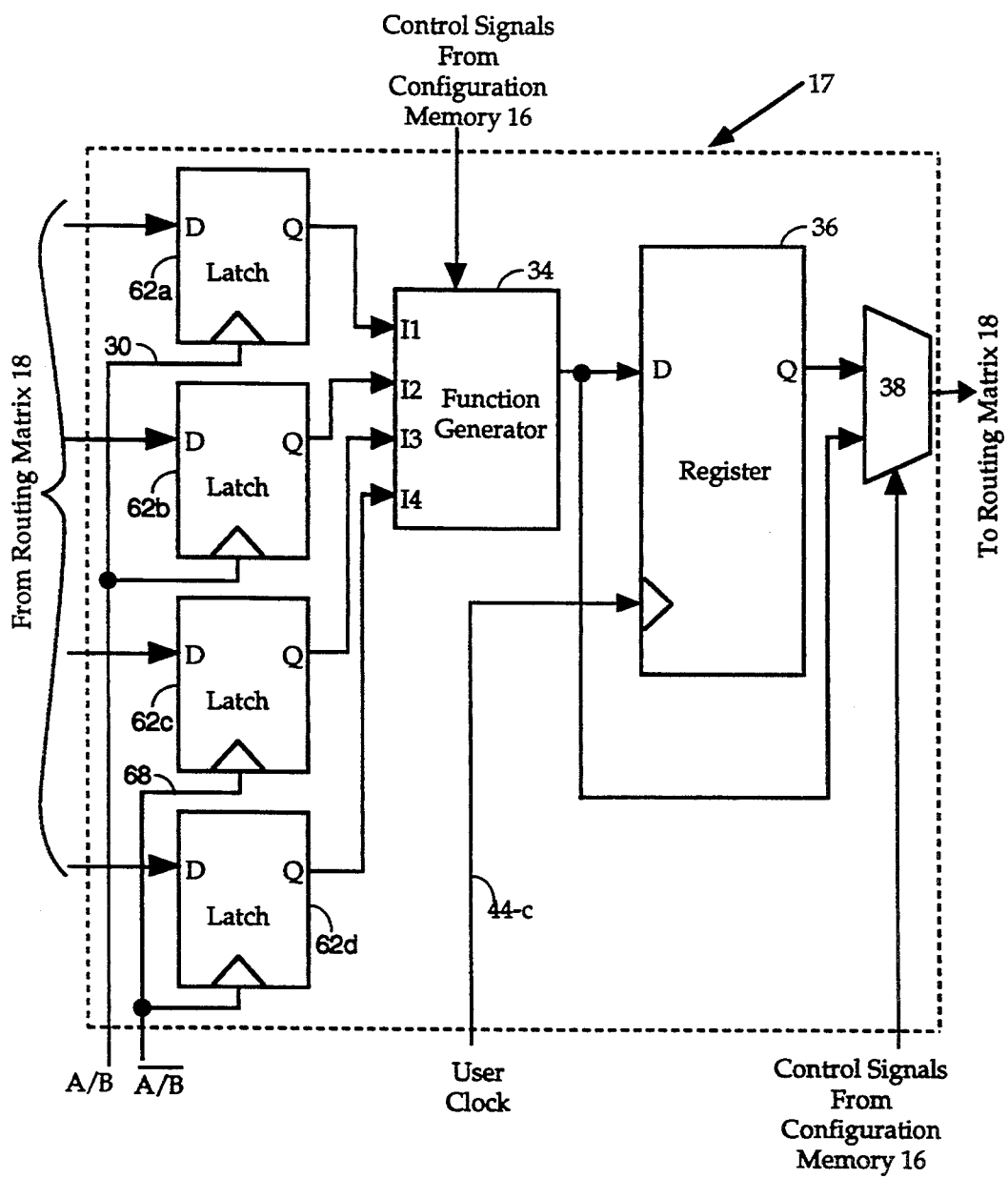
FIG. 6B is a block diagram showing a configurable logic block according to another embodiment of the present invention.

In another embodiment, the data latches may be arranged so that their outputs are directed to the input, rather than the output, of the function generator 34. Such an embodiment is shown in FIG. 6B. In FIG. 6B, latches 62a–62d are provided at the input of CLB 17, and store signals present in routing matrix 18 during two different periods of operation. Latches 62a and 62b pass signals present on their respective D input terminals when the A/B signal is high and capture the data present when the A/B signal goes low. Latches 62c and 62d pass data present on their D input terminals when the A/B signal is low and capture the data present when A/B goes high. All four outputs of latches 62a–62d are always provided to the I1–I4 terminals of function generator 34, even though at any one time two of latches 62a–62d are passing data from routing matrix 18 and two are storing data received earlier from routing matrix 18. Thus on the two phases of the A/B clock signal, lines in routing matrix 18 can be used for different purposes. For example, the same routing matrix line segment, or string of line segments could be used to provide a signal to latch 62a during the first phase of the A/B clock signal, and a signal to latch 62c during the second phase of the A/B clock signal. Both signals would be used by function generator 34. Latches 62a through 62d allow the routing matrix 18 to be conveniently reused during the two phases. Of course, more than two phases may be provided by separately clocking latches 62a–62d with more than two clock signals.

ROUTING MATRIX

Figure 6C:
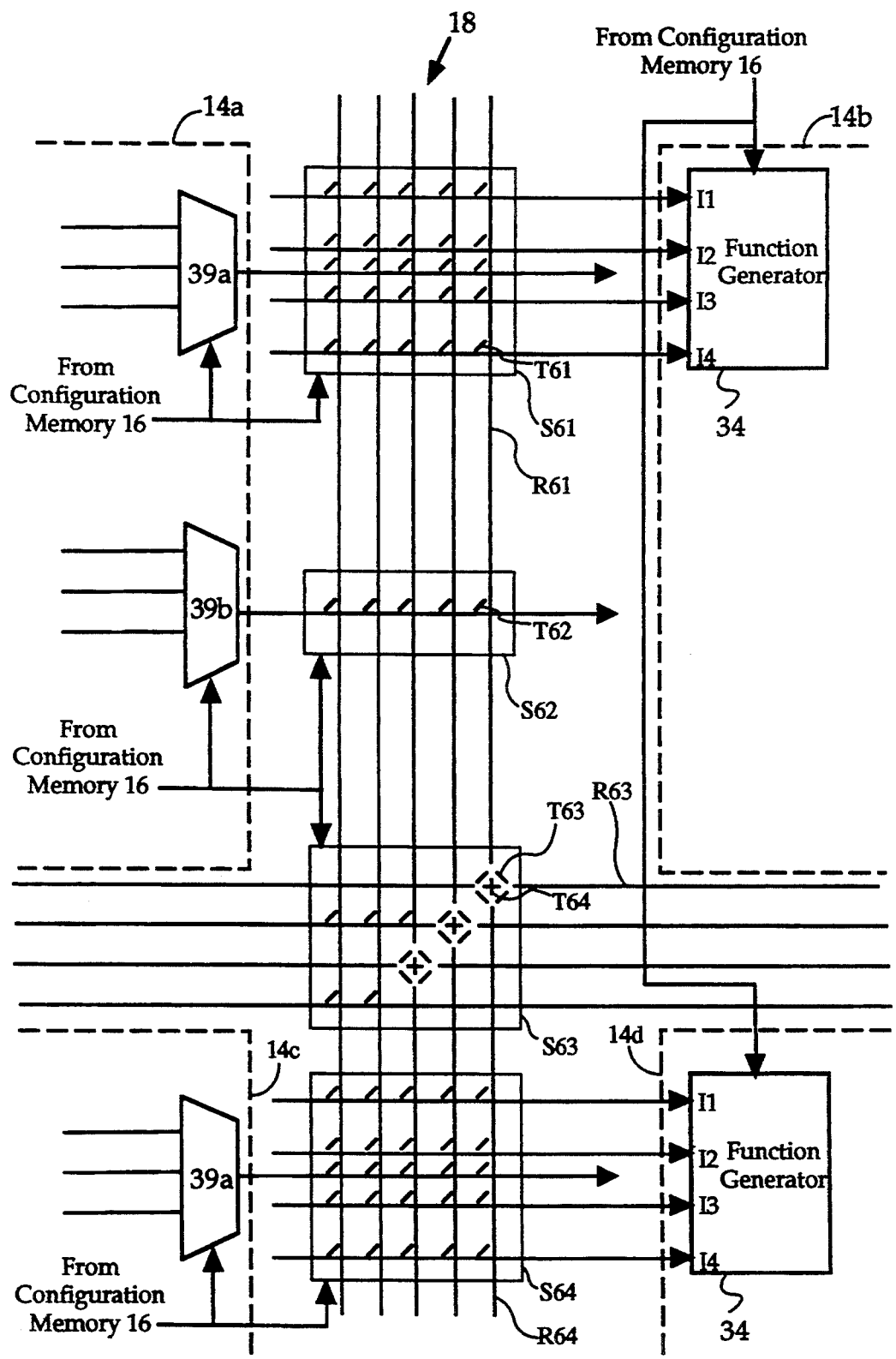
FIG. 6C shows a configurable routing matrix with which the invention may be used.

FIG. 6C shows one embodiment of a routing matrix 18 with which the invention can be used. Also shown at the perimeter of FIG. 6C are parts of four CLBs 14a, 14b, 14c, and 14d. Transistors in routing matrix 18 are represented by short lines extending between lines which they may connect. For example, transistor T61 extends between routing line R61 and input line I4 in CLB 14b. Transistor T62 can connect the output of multiplexer 39b in CLB 14a to routing line R61. Transistor T63 can connect routing line R61 to routing line R63 and transistor T64 can connect routing line R61 to routing line R64. Control of each transistor is provided by a line from configuration memory 16 to the gate of the transistor. For simplicity in the drawing, most transistors are not labeled and the connections from configuration memory 16 to each gate are represented by a single line to each of switch boxes S61, S62, S63, and S64. Other routing matrices are shown in the 1993 Xilinx data book incorporated by reference. The purpose of FIG. 6C is to illustrate the relationship between the routing matrix 18, the CLBs 14, and the configuration lines from configuration memory 16. The novel aspect of FIG. 6C is that signals from configuration memory 16 can reconfigure routing matrix 18 in conjunction with reconfiguring the CLBs 14, and thereby use the same routing line in routing matrix 18 for more than one connection, as discussed above.

MODES OF OPERATION

The present invention provides three modes of operation of the CLBs 14. The CLBs 14 may be used to implement a simple, high speed, asynchronous, combinatorial logic function. This first mode exists when the configuration data stored in the first array are identical to the configuration data stored in the second array. In this mode, the first and second output switches 39a, 39b are configured to receive and pass directly data output by the function generator 34. The B output path is either not used, or the outputs of the switches 39a, 39b are coupled together to form a single output path. The A/B signal on the line 30 and the user's clock signal on the line 44 may be asserted, but this first mode does not utilize the data latches 42a, 42b and the registers 36a, 36b. Therefore, the A/B signal and the user's clock signal are ignored. This mode does not utilize the ability of the present invention to increase the number of logic functions implemented by the FPGA 10.

The second mode of operation is a high speed registered mode. This mode is synchronous. As with the high speed asynchronous mode, this second mode exists when the configuration data stored in the first and second arrays are identical. The A/B signal is not asserted (held high) so that the first data latch 42a passes data to the first register 36a during both the A and B periods of the user's clock cycle. Then on the next rising edge of the user's clock, the data passed through the first data latch 42a are clocked into the first register 36a. In this mode, the output of the CLB 14 does not change until the beginning of the next cycle of the user's clock. This mode does not utilize the B output path and does not utilize the ability of the present invention to increase the number of logic functions implemented by the FPGA 10 of the present invention.

Figure 7:
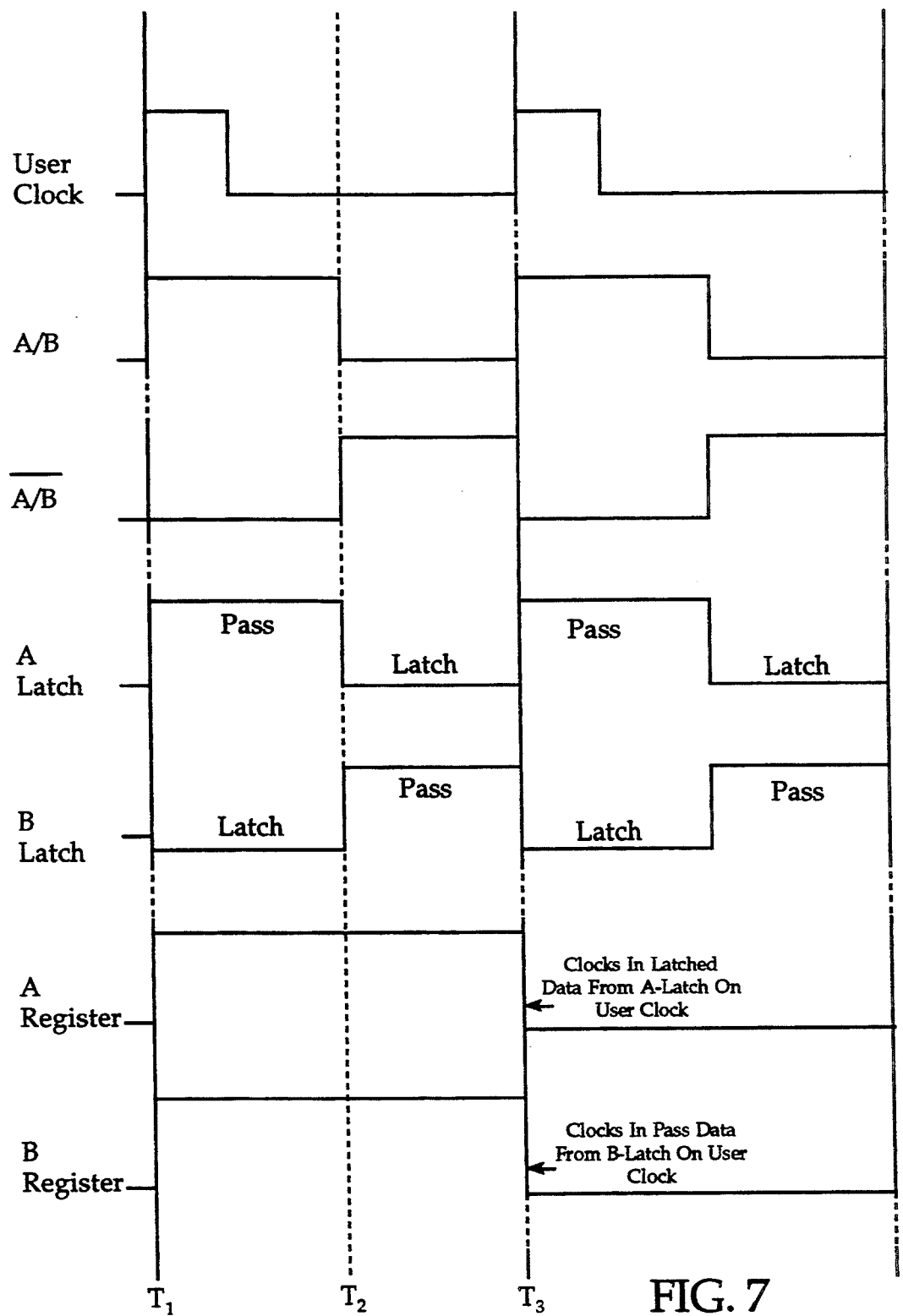
FIG. 7 is a timing diagram showing the A/B control signal, the latching signals, and the register clocking signal during operation.

Referring now to FIG. 7, the third mode is discussed. A timing diagram showing the re-configuration control signals within the FPGA 10 of the present invention is shown. FIG. 7 shows two cycles of an exemplary user's clock, two cycles of an exemplary A/B signal, two cycles of an exemplary A/B' signal, four exemplary states of the latch 42a, four exemplary states of the latch 42b, two exemplary outputs of the register 36a, and two exemplary outputs of the register 36b. While the A/B and A/B' signals are shown to transition at the midpoint T₂, in the cycle of the user's clock, such a division is not required. The A/B signal may divide a cycle of the user's clock at many intermediate points. A limitation on the division is that both the A period and the B period must be of sufficient length that all signals in the FPGA 10 may propagate through the CLBs 14 and settle so that signals are set up at the inputs of latches and registers long enough for successful storage.

FIG. 7 aids in explaining the third mode of operation of the CLB 14. The third mode of operation utilizes the ability of the present invention to increase the number of logic functions performed by the FPGA 10. In the third mode, the configuration of the CLB 14 and the configuration of the configurable routing matrix 18 during the A period is different than the configuration during the B period. The third mode is referred to herein as the pipeline mode.

At the beginning of a user's clock cycle, T₁, the A/B signal also begins a cycle. In the A period, the A/B signal is high, so that the CLBs 14 and the routing matrices 18 are configured with the first set of configuration data. During the A period, the first data latch 42a passes data, and the data latch 42b latches data.

On the transition of the A/B signal at T₂, the A/B signal now selects the second set of configuration data from memory 16 and thus reconfigures the CLBs 14 and the configurable routing matrices 18. The first data latch 42a latches the data at its input, and the second data latch 42b passes the data at its input.

At the beginning of the next cycle of the user's clock, T₃, the A/B signal again transitions. Once again, the CLBs 14 and configurable routing matrices 18 are reconfigured according to the first set of configuration data. The first data latch 42a passes data, and the second data latch 42b latches data. On the rising edge of the user's clock and the A/B signal, the first and second registers 36a, 36b clock in data. The register 36a clocks in the latched data from data latch 42a, and the register 36b clocks in the pass data from data latch 42b. Thus, the first register 36a stores the output of the function generator 34 when it was configured during the earlier portion of the user's clock, according to the first set of configuration data. The second register 36b stores the output of the function generator 34 when it was configured during the later portion of the user's clock, according to the second set of configuration data.

On each transition of the A/B signal, the first and second output switches 39a, 39b are re-configured. In many applications, output switches 39a and 39b are not reconfigured during the user clock cycle. However, in the embodiment of FIG. 6A, the structure allows for reconfiguration of the output switches, and in some applications it may be desirable. For example, switch 39a may pass data from function generator 34 during the A period and from register 36a during the B period. Meanwhile, switch 39b may pass data from latch 42b during both periods.

The routing matrices 18 are also re-configured on each transition of the A/B signal. Just as with the CLBs 14, during the A period the inputs to the CLB 14: may come from different sources than during the B period. On each transition of the A/B signal, the routing matrices are re-configured to present the correct inputs to each CLB 14 and to route correctly the outputs of the CLB 14.

Not all tiles 12 of the FPGA 10 of the present invention need be configured in the same mode. Some tiles 12 may be configured in the high speed asynchronous mode, others in the high speed registered mode, and yet others in the pipeline mode. Thus, the CLB 14 is capable of greatly increasing the number of logic functions implemented in the FPGA 10 over the number of logic functions implemented in the prior art FPGA 10. The present invention achieves this increase without a sizable increase in the silicon area of the FPGA 10 over the prior art.

Figure 8:
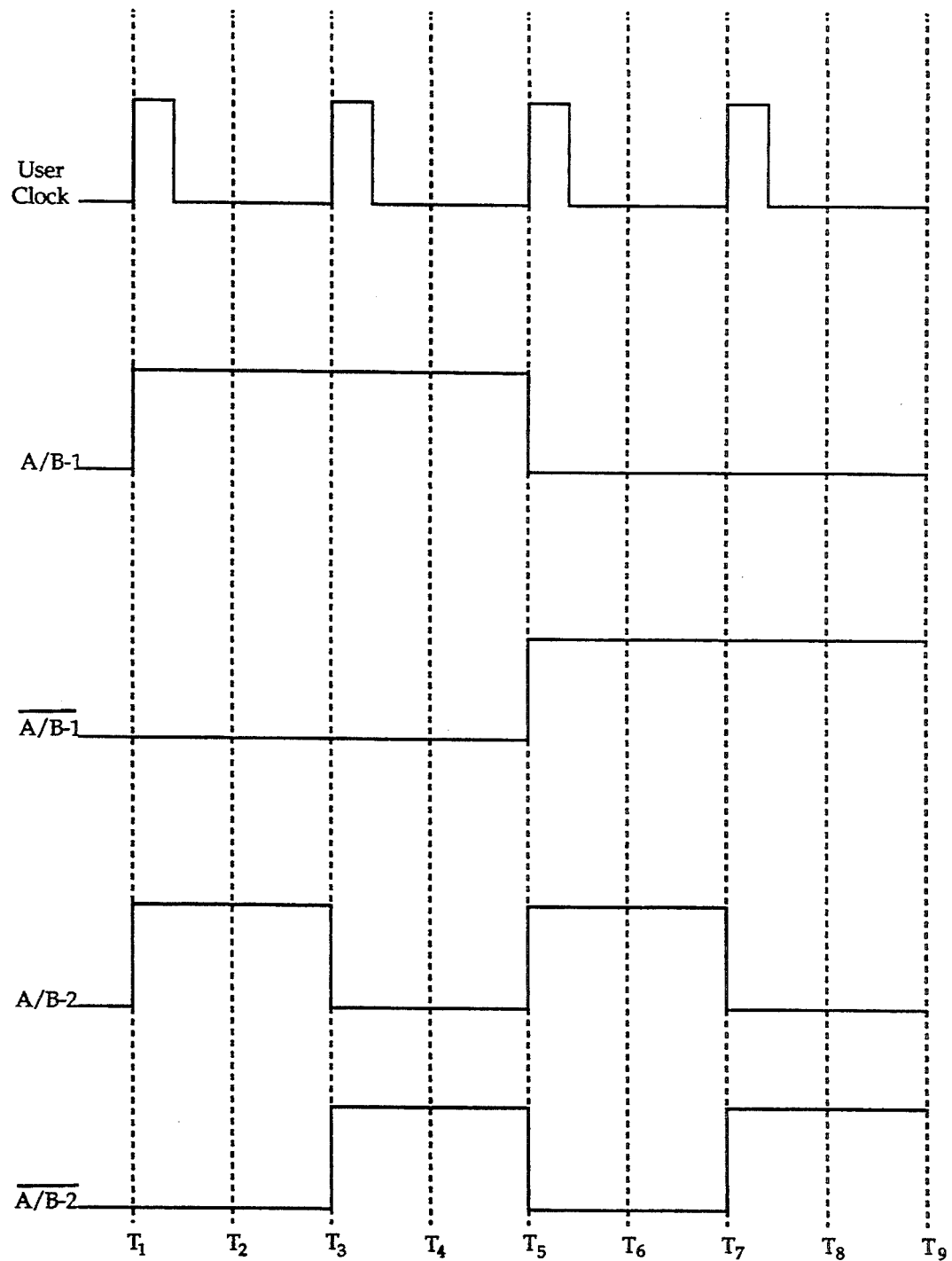
FIG. 8 is a timing diagram showing a register clocking signal, a first alternative A/B control signal, A/B-1, and a second alternative A/B control signal, A/B-2.

FIG. 7 showed a complete cycle of the A/B signal taking place within one cycle of the user's clock. The A/B signal however, may have a period longer than one cycle of the user's clock. Referring now to FIG. 8, a timing diagram shows four cycles of the user's clock compared to a first alternative A/B signal A/B-1 and its inverse $\overline{A/B-1}$; and to a second alternative A/B signal A/B-2 and its inverse $\overline{A/B-2}$. In FIG. 8, the first portion of the A/B-1 signal is two cycles of the user's clock. Similarly, the second portion of the A/B-1 signal is two cycles of the user's clock. The first portion of the A/B-2 signal is one cycle of the user's clock. The second portion of the A/B-2 signal is also one cycle of the user's clock. As described in connection with FIG. 7, the first portion of an A/B signal need not be equal in length to the second portion of the A/B signal. FIG. 8 illustrates that, in general, the A/B signal may be of any length, whether greater than, equal to, or less than the period of the user's clock.

EXAMPLE

Figure 9:
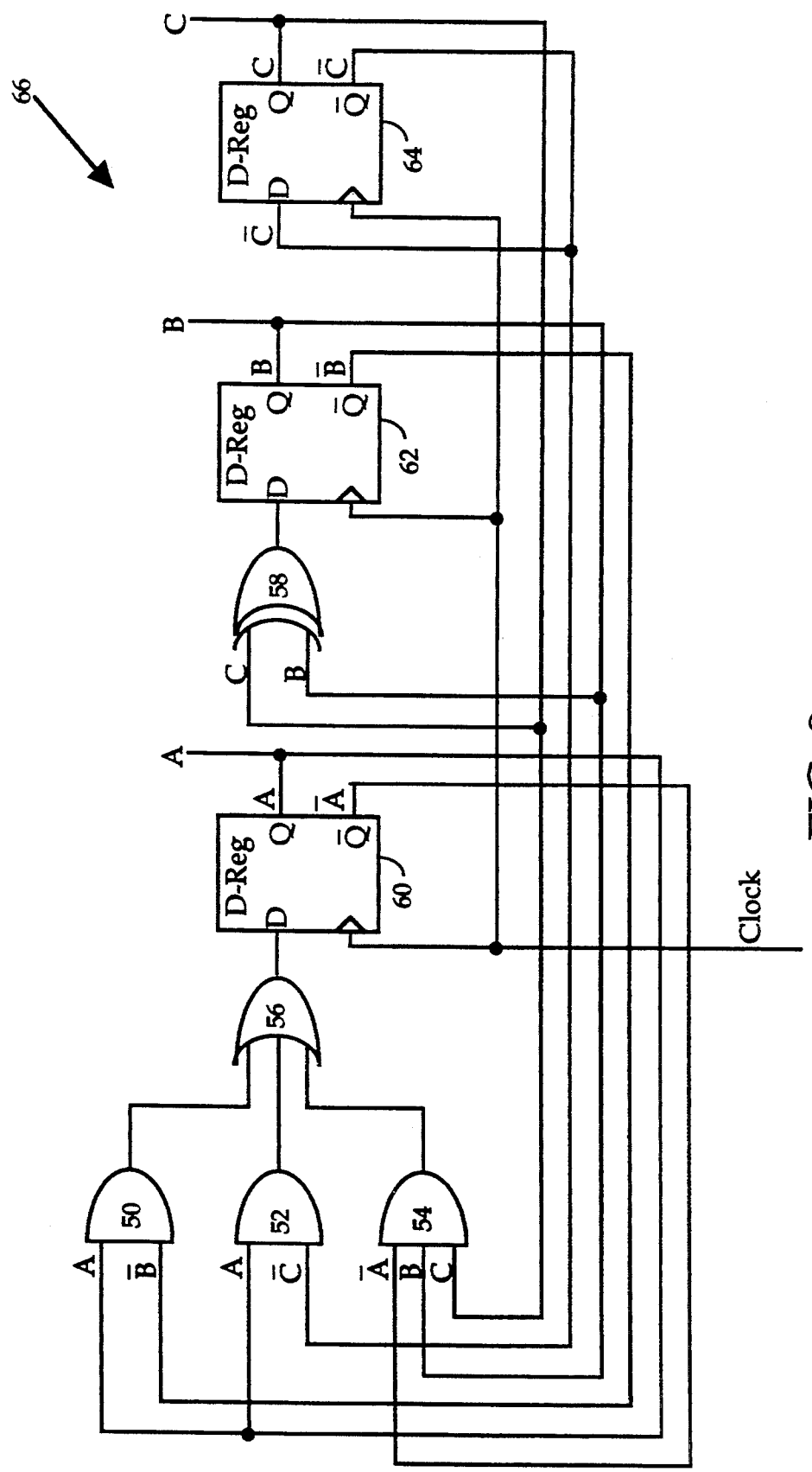
FIG. 9 is a circuit diagram of an exemplary logic circuit that may be implemented by an FPGA.

Referring now to FIG. 9, a block diagram of a 3-bit counter that may be implemented in an FPGA 10 is shown. The counter has three outputs A, B, and C and a clock input. The 3-bit counter comprises a first two-input AND gate 50, a second two-input AND gate 52, a three-input AND gate 54, a three-input OR gate 56, a two-input XOR gate 58, a first register 60, a second register 62, and a third register 64, all connected as shown.

Figure 10:
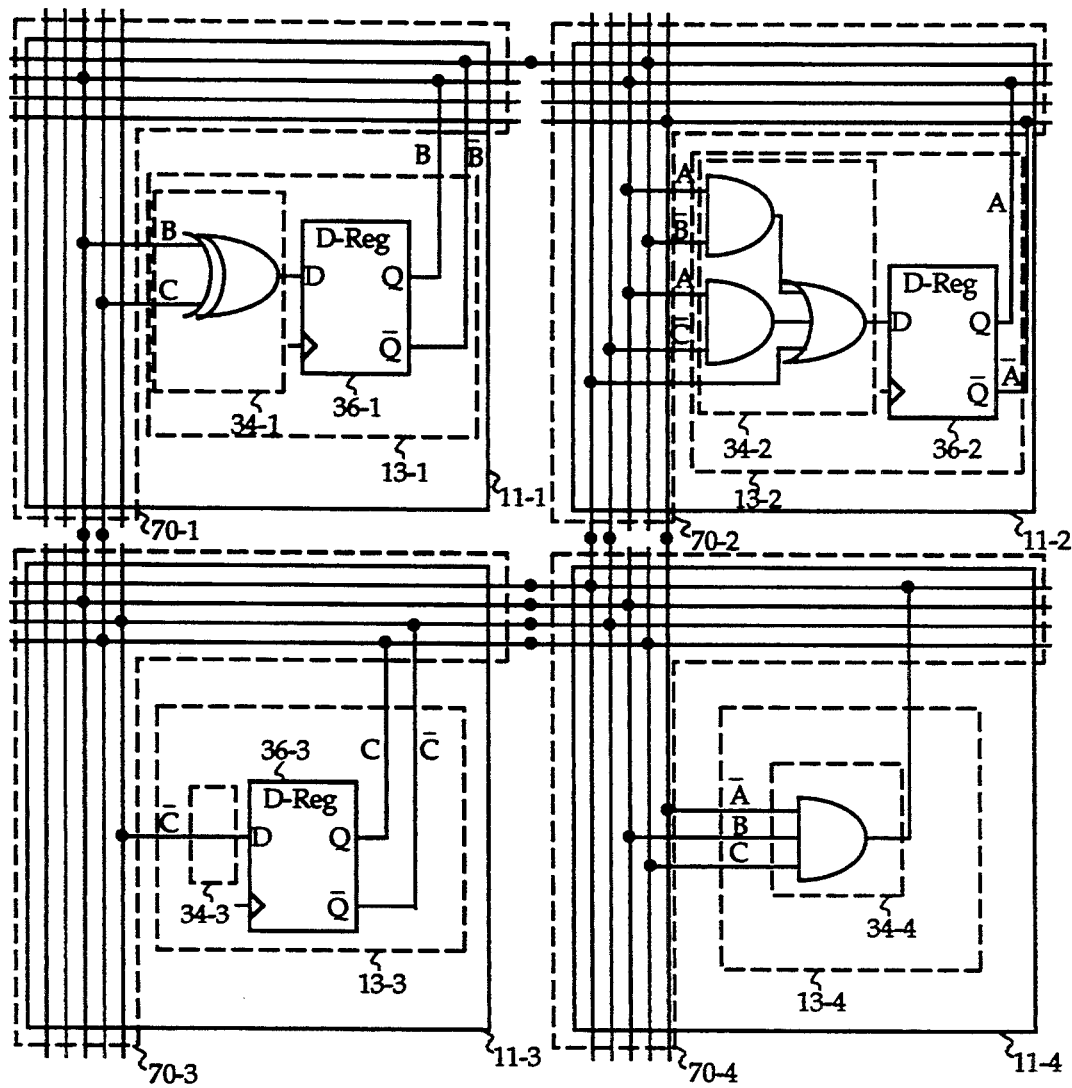
FIG. 10 is a block diagram showing the implementation of the exemplary logic circuit of FIG. 9 utilizing a prior art FPGA.
Figure 11:
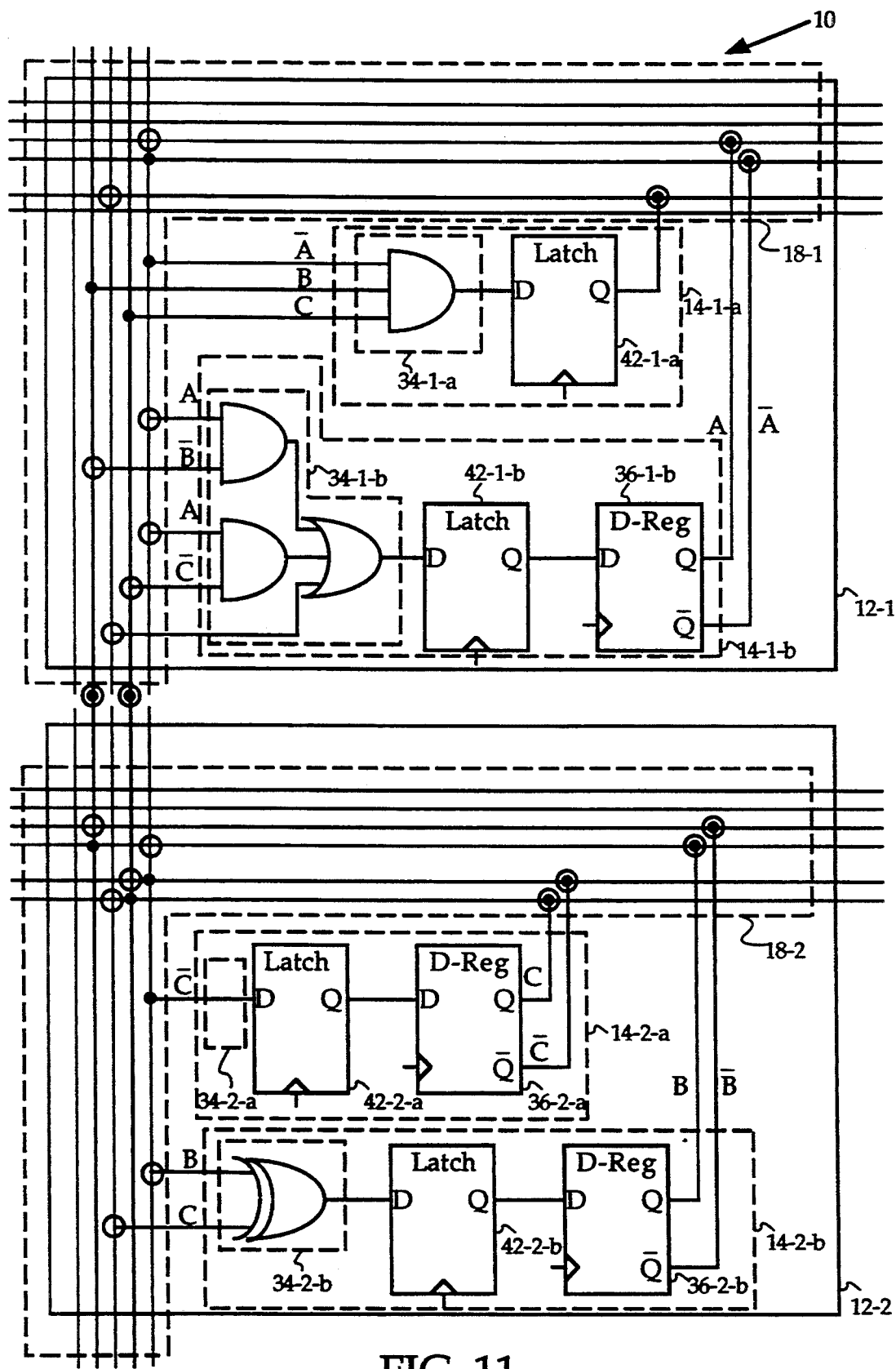
FIG. 11 is a block diagram showing the implementation of the exemplary logic circuit of FIG. 9 utilizing the FPGA of the present invention.

For FIGS. 9, 10, and 11, the example shows $\overline{Q}$ as an output of the CLB. This is done for the purposes of more clearly illustrating the advantages of reconfiguring the routing matrix. For FPGAs, since Q can drive a programable look-up table where it can be inverted to $\overline{Q}$, only one output is needed. Therefore, FIGS. 4 and 5 did not show $\overline{Q}$ as an output of the CLB.

Referring now to FIG. 10, a block diagram of an implementation of the 3-bit counter using a prior art FPGA is shown. The implementation comprises prior art tiles 11-1, 11-2, 11-3, and 11-4. The configurable routing matrices 70-1, 70-2, 70-3, and 70-4 interconnect these tiles. The connections of the outputs of the tiles 11-1, 11-2, 11-3, and 11-4 are made through the configurable routing matrix 70 of each tile 11. Each dot represents a portion of the routing matrices 70 that has been connected by storing data in their associated configuration memory. For clarity, the output switches, configuration memories, control lines, and clock lines are not shown.

The first prior art CLB 13-1 is configured so that the function generator 34-1 implements a two-input XOR function, and the output switch 38-1 (not shown) passes the output of register 36-1. The second prior art CLB 13-2 is configured so that the function generator 34-2 implements the three input, two level digital function of the equation $D = A\overline{B} + A\overline{C} + \overline{A}BC$, where $\overline{A}BC$ is the output of function generator 34-4 and D is the output of function generator 34-2. The output switch (see output switch 38 of FIG. 5) of the second prior art CLB 13-2 is configured to pass the output of register 36-2. The third prior art CLB 13-3 is configured so that the function generator 34-3 inverts the signal to output $\overline{C}$, and the output switch 38-3 (not shown) passes the output of register 36-3. Prior art CLB 13-4 is configured to implement a three-input AND function $\overline{ABC}$. The output switch of prior art CLB 13-4 is configured to pass the output of the function generator 34-4. The configurable routing matrices 70-1, 70-2, 70-3, and 70-4 are connected as indicated by the black dots to form the counter of FIG. 9.

Referring now to FIG. 11, a block diagram of an implementation of the 3-bit counter using the FPGA 10 of the present invention is shown. The configurable routing matrices 18 are shown as dashed tines around the connections made by the configurable routing matrices 18. The connections are shown with either a solid connector or a hollow connector. The routing matrices 18 are configured in the A period to implement the connections indicated by the solid connectors. In the B period, the configurable routing matrices 18 are configured to make the connections indicated by the hollow connectors. The routing matrices 18 are configured to implement the connections indicated by a hollow connector surrounding a solid connector in both the A period and in the B period. This corresponds to the case where the data stored in memory cell 21-x is identical to the data stored in memory cell 23-x, where x is between 1 and n of FIG. 3. The configurable routing matrix 18 is larger than the prior art configurable routing matrix but is not necessarily twice the size of the prior art configurable routing matrix. For clarity, the output switches 39a-1, 39b-1, 39a-2, and 39b-2, configuration memories, control lines, and clock lines corresponding to those of FIG. 6A are not shown.

In FIG. 11, the 3-bit counter utilizes two tiles 12-1 and 12-2 of the FPGA 10. Each tile performs two logic functions, one during the A period and another during the B period. In FIG. 11, numerals 34-1-a and 34-1-b represent the same physical device which implements different function generator logic in the two periods. During the A period, the first CLB 14-1-a of tile 12-1 is configured so that the function generator logic 34-1-a is a three-input AND gate and the output switch 39-1 (not shown) passes data from the first data latch 42-1-a. When tile 12-1 is reconfigured in the B period, the function generator logic 34-1-b is the three input logic function having the equation $D = A\overline{B} + A\overline{C} + \overline{ABC}$, where D is the output of the function generator logic 34-1-b. Note that the output of function generator logic 34-1-a is latched into data latch 42-1-a at the end of the A period. The output of the data latch configuration 42-1-a is available to, and used by, function generator logic 34-1-b in the following B period. The output switch of CLB 14-1, equivalent to switch 39b of FIG. 6A, is configured to pass data from the register 36-1-b and is not shown.

The tile 12-2 is configured in the A period so that the function generator logic 34-2-a simply passes the input $\overline{C}$. The output switch is configured to pass data from the register 36-2-a. In the B period, the function generator logic 34-2-b implements a two-input XOR function, and the output switch (equivalent to 39b of FIG. 6A) is configured to output data from the register configuration 36-2-b.

A comparison of FIG. 10 with FIG. 11 shows that the two-configuration embodiment of the present invention effectively doubles the number of logic functions the FPGA 10 can implement over the prior art FPGA. Where four prior art tiles were required to implement the 3-bit counter, only two tiles 12 of the present invention are required. This embodiment of the present invention requires a slight increase in the silicon area because of the additional memory for storing configuration data and the increase in size of the configurable routing matrices 18 and the CLBs 14, but a tile which offers two configurations requires much less than twice the area of a one-configuration tile.

The re-configuration may take place within a cycle of the user's clock. Since most users require a clock cycle greater than the delay of two tiles, if the user partitions the logic carefully between those that run on A and those that run on B, the only speed penalty will be that time which it takes for elements in the data path to switch configuration. The elements include pass gates in the routing matrix 18, pass gates or other devices in function generators 34, and output switches 39, each path element being controlled by a multiplexer 28-x, where x is between 1 and n of FIG. 3. This multiplexer is a high speed element, the elements in the data path are high speed, and the elements switch in parallel, therefore the penalty is small. There can be minimal loss of speed apparent to the user. In order to further minimize the speed penalty apparent to the user, some of switches 28-1 to 28-n are more critical than others. In the embodiment of FIG. 6A, since signals stored in the latches and registers reach switches 39a and 39b and then pass gates in routing matrix 18 before they reach function generators 34 of the next CLB downstream in the path, during reconfiguration it is more critical that switches 39a and 39b and the pass transistors in routing matrix 18 switch fast (before arrival of the data signal) than it is that function generators 34 switch fast. Thus speed of output signals from those of switches 28-1 through 28-n which control output switches 39a, 39b, and routing matrix 18 pass transistors should be maximized. To this end, the most critical output signals from switches 28-1 through 28-n should be placed on metal lines. Additional measures such as controlling the sizes of switches 28-1 through 28-n may be taken to maximize the most critical speeds while minimizing area when speed is somewhat less critical. Of course in other embodiments, for example FIG. 6B, the speed criticality is different.

SUMMARY

Thus, the present invention significantly increases the number of logic functions that may be implemented per area over the prior art tile of the same process technology without necessarily impacting performance.

While the present invention has been described with reference to certain preferred embodiments, those skilled in the art will recognize that various modifications may be provided. For example, the CLBs 14 of the present invention may be used on an FPGA along with prior art CLBs in a variety of configurations. Thus, such an FPGA would have some tiles that can operate in registered and asynchronous modes (prior art) along with others that can operate in a pipeline mode. For another example, the programmable logic array of the present invention need not be limited to a single silicon chip but may be implemented in multiple chips. For yet another example, although the invention has been described in connection with FPGA architectures, it may just as well be used with other architectures which are field programmable and reconfigurable. The invention may be used in a device which does not include logic blocks but simply includes switching and routing matrices. Further, the invention may be used in a device such as a PLA which includes only a single programmable logic device.

The detailed description above focused on embodiments which were configured using SRAM configuration memory cells. Since a change of configuration can be achieved in the present invention without changing the configuration memory, it is feasible to form the configuration memory from such one-time-programmable technologies as fuses or antifuses, or from technologies which are more difficult to reprogram such as EPROMs or EEPROMs. These and other variations upon and modifications to the preferred embodiments are provided for by the present invention, which is limited only by the following claims.

What is claimed is:

1. A programable array comprising:
   a configuration memory having a first storage means for storing a first set of configuration data, a second storage means for storing a second set of configuration data and a switching means coupled for outputting one of the first set and second set of configuration data; and
   a configurable routing matrix for selectively coupling conductive lines in response to configuration data, the configurable routing matrix having configuration inputs coupled to the switching means.

2. The programable array of claim 1 further comprising a configurable logic block having at least one configuration input at least one data input and at least one data output for implementing logic functions on input data in response to the first set and second set of configuration data, the configuration input of the configurable logic block coupled to an output of the switching means.

3. The programable array of claim 2, wherein the configuration memory further comprises a third storage means for storing a third set of configuration data.

4. The programable array of claim 2, wherein the switching means couples the first storage means to the configurable logic block and the configurable routing matrix during a first portion of a user clock cycle and the switching means couples the second storage means to the configurable logic block and the configurable routing matrix during a second portion of the user clock cycle.

5. The programable array of claim 2, wherein the configuration memory comprises more than two storage means and the switching means selectively couples each storage means to the configurable logic block and the configurable routing matrix during a respective portion of a user clock cycle.

6. The programmable array of claim 2, wherein the switching means selectively couples the first storage means to the configurable logic block and the configurable routing matrix during a first time period and couples the second storage means to the configurable logic block and the configurable routing matrix during a second time period, the first and second time periods being successive.

7. The programmable array of claim 6 in which each of the successive time periods is at least as long as a user clock cycle.

8. The programmable array of claim 1, wherein:
   the first storage means comprises a plurality of memory cells, each having an input and an output, each memory cell storing a bit of the first set of configuration data; and
   the second storage means comprises a plurality of memory cells, each having an input and an output, each memory cell storing a bit of the second set of configuration data.

9. The programmable array of claim 8, wherein the memory cells are static random access memory cells.

10. The programmable array of claim 8 wherein the memory cells are fuses.

11. The programmable array of claim 8 wherein the memory cells are antifuses.

12. The programmable array of claim 8 wherein the memory cells are EPROM cells.

13. The programmable array of claim 8 wherein the memory cells are EEPROM cells.

14. The programmable array of claim 8, wherein each memory cell in the first storage means has a corresponding memory cell in the second storage means.

15. The programmable array of claim 8, wherein the configuration memory further comprises a plurality of memory cells in addition to the first storage means and the second storage means, the plurality of memory cells further configuring the routing matrix.

16. The programmable array of claim 1, wherein the switching means is a multiplexer.

17. The programmable array of claim 1 wherein the switching means comprises a sense amplifier and a plurality of address lines.

18. The programmable array of claim 1, wherein the switching means comprises a plurality of switches, each switch having a first data input coupled to a configuration memory cell in the first storage means, a second data input coupled to the corresponding configuration memory cell in the second storage means, and an output forming an output of the configuration memory.

19. The programmable array of claim 18 wherein the plurality of switches are a plurality of two-to-one multiplexers.

20. The programmable array of claim 2, wherein the configurable logic block comprises:
   a function generator for implementing a logic function specified by configuration data, the function generator having at least one configuration input, at least one data input, at least one data output, the at least one configuration input coupled to the switching means, the at least one data input coupled to the configurable routing matrix;
   a first output device for storing the output of the function generator from a first period, the first output device having a data input coupled to the output of the function generator and a data output; and
   a second output device for storing the output of the function generator from a second period, the second output device having a data input coupled to the output of the function generator and a data output.

21. The programmable array of claim 20 in which the first output device further includes a configuration input coupled to the configuration memory, and the second output device further includes a configuration input coupled to the configuration memory.

22. The programmable array of claim 20 in which the data outputs of the first and second output devices are coupled to the configurable routing matrix.

23. The programmable array of claim 20, wherein the first output device selectively stores and outputs the output of the function generator configured with the first set of data stored in the first storage means of the configuration memory and the second output device selectively stores and outputs the output of the function generator configured with the second set of data stored in the second storage means of the configuration memory.

24. The programmable array of claim 20, wherein the first output device comprises:
- a latch for storing and passing data in response to a signal at a latch enable input, the latch having a data input, a latch enable input, and a data output, the data input of the latch coupled to the output of the function generator;
- a register having a data input, a clock input and a data output for storing data in response to a clock signal at the clock input, the data input of the register coupled to the data output of the latch, and the clock input of the register coupled to receive a clock signal; and
- an output switch having a plurality of data inputs, a configuration input, and a data output, for outputting one of a plurality of signals.

25. The programmable array of claim 24 in which a first data input of the output switch is coupled to the output of the latch, and a second data input of the output switch is coupled to the output of the register, the configuration input of the output switch is coupled to the configuration memory, and the output of the output switch is coupled to the configurable routing matrix.

26. The programmable array of claim 25 in which a third data input of the output switch is coupled to the output of the function generator.

27. The programmable array of claim 24, wherein the second output device comprises:
- a latch for storing and passing data in response to a signal at a latch enable input, the latch having a data input, a latch enable input, and a data output, the data input of the latch coupled to the output of the function generator;
- a register having a data input, a clock input and a data output for storing data in response to a clock signal at the clock input, the data input of the register coupled to the data output of the latch, and the clock input of the register coupled to receive a clock signal; and
- an output switch having a plurality of data inputs, a configuration input and a data output, for outputting one of a plurality of signals, a first data input of the output switch coupled to the output of the function generator, a second data input of the output switch coupled to the output of the latch, and a third input of the output switch coupled to the output of the register, the configuration input of the output switch coupled to the configuration memory and the output of the output switch coupled to the configurable routing matrix.

28. The programmable array of claim 24, wherein the output switch is a multiplexer.

29. A programmable array comprising:
- a configuration memory having a first storage means for storing a first set of configuration data, a second storage means for storing a second set of configuration data and a switching means coupled for outputting one of the first set and second set of configuration data; and
- a configurable logic block having configuration inputs, data inputs and data outputs for implementing logic functions on input data in response to the first set and second set of configuration data, the configuration inputs of the configurable logic block coupled to outputs of the switching means.

30. A programmable array comprising:
- means for providing a logic signal;
- a first storage means which receives the logic signal;
- a second storage means which receives the logic signal;
- means for passing the logic signal through the first storage means during a first time period and passing the logic signal through the second storage means during a second time period;
- means for coupling outputs of the first and second storage means to different lines during a first time period and a second time period.

31. The programmable array of claim 30, wherein the different lines comprise a first line, a second line, a third line and a fourth line, wherein the means for coupling couples the output of the first storage means to the first line during the first time period and to the third line during the second time period, and wherein the means for coupling couples the output of the second storage means to the second line during the first time period and to the fourth line during the second time period, 32. The programmable array of claim 30 wherein the first storage means is a first latch and the second storage means is a second latch.

33. The programmable array of claim 32 wherein the first latch is connected to a line in a routing matrix during a first period and the second latch is connected to the line in the routing matrix during a second period.

34. A programmable array comprising:
- means for providing a logic signal;
- a first storage means which receives the logic signal;
- a second storage means which receives the logic signal;
- means for passing the logic signal through the first storage means during a first time period and passing the logic signal through the second storage means during a second time period;
- means for coupling outputs of the first storage means to at least one routing line during a first time period and the second storage means to the same at least one routing line during a second time period.

35. The programmable array of claim 34 wherein the first storage means is a first latch and the second storage means is a second latch.

* * * * *

UNITED STATES PATENT AND TRADEMARK OFFICE
CERTIFICATE OF CORRECTION

PATENT NO. : 5,426,378

DATED : June 20, 1995

INVENTOR(S) : Randy T. Ong

It is certified that error appears in the above-identified patent and that said Letters Patent is hereby corrected as shown below:

Col. 8, line 17, "$\overline{A/B}$" should read --A/B--.

Col. 8, line 23, "the signal" should read --the $\overline{A/B}$ signal--.

Col. 11, line 2, "point $T_2$," should read --point, $T_2$,--.

Col. 11, line 61, "CLB 14: may" should read --CLB 14 may--.

Col. 12, line 12, "signal however," should read --signal, however,--.

Col. 13, line 16, "tines" should read --lines--.

Signed and Sealed this

Twenty-eighth Day of November 1995

Attest:

BRUCE LEHMAN

*Attesting Officer*     *Commissioner of Patents and Trademarks*